United States Patent
Lee et al.

(10) Patent No.: US 7,248,477 B2
(45) Date of Patent: Jul. 24, 2007

(54) FAN-SHAPED HEAT-DISSIPATING DEVICE

(75) Inventors: I-Tseng Lee, Hsin Tien (TW);
Shih-Chang Ku, Hsin Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 316 days.

(21) Appl. No.: 10/958,401

(22) Filed: Oct. 6, 2004

(65) Prior Publication Data
US 2005/0237718 A1    Oct. 27, 2005

(30) Foreign Application Priority Data
Apr. 27, 2004    (TW) .............................. 93206497 U

(51) Int. Cl.
*H05K 7/20* (2006.01)
*F28F 7/00* (2006.01)

(52) U.S. Cl. ..................... 361/697; 165/80.3; 165/185; 361/703; 361/695

(58) Field of Classification Search ..................... None
See application file for complete search history.

(56) References Cited

U.S. PATENT DOCUMENTS

| | | | |
|---|---|---|---|
| 6,064,574 A * | 5/2000 | Yu et al. ..................... | 361/704 |
| 6,181,556 B1 * | 1/2001 | Allman ........................ | 361/690 |
| 6,295,202 B1 * | 9/2001 | Tucker et al. ............... | 361/704 |
| 6,411,511 B1 * | 6/2002 | Chen ........................... | 361/697 |

\* cited by examiner

*Primary Examiner*—Gregory Thompson
(74) *Attorney, Agent, or Firm*—Birch, Stewart, Kolasch & Birch, LLP

(57) ABSTRACT

A fan-shaped dissipating device, which is assembled on a chip of an erect PCB, has a conductive board, and a plurality of fins. The fins are respectively connected on an outside surface of the conductive board. Each of the fins has a top end and a bottom end. An interval between each two adjacent top ends of the fins is larger that between each two adjacent bottom ends of the fins. The fins are arranged in a radiating manner toward two sides from the bottom ends to the upper ends, therefore reducing the density of the accumulated air between the top ends of the fins because of rising hot air, and providing a better dissipating effect.

12 Claims, 7 Drawing Sheets

FAN-SHAPED HEAT-DISSIPATING DEVICE

BACKGROUND OF THE INVENTION

This Nonprovisional application claims priority under 35 U.S.C. § 119(a) on Patent Application No(s). 093206497 filed in Taiwan, Republic of China on Apr. 27, 2004, the entire contents of which are hereby incorporated by reference.

1. Field of the Invention

The present invention relates to a fan-shaped heat-dissipating device, and especially to a heat-dissipating device adapted to a chip of an erect PCB for heat dissipation.

2. Description of Prior Art

As the density of an IC (integrated circuit) increases, information product chip produces much heat, and the temperature of the chip usually exceeds the load range. In particular, the operating speed and the processing function of the CPU (central processing unit) are increasing continually. Without proper heat dissipation, the components run the risk of damage, to the point of interrupting even the host.

To solve the dissipation problem of the chip, a heat-dissipating device with multiple fins is usually mounted on the chip. The conventional art is shown in FIG. 1, which is a heat-dissipating device mounted on a chip of an erect PCB. The heat-dissipating device has a rectangular conductive board 1 and a plurality of fins 3 extending from the conductive board 1. The heat-dissipating device is made of highly conductive material. When the temperature of a chip 2 rises, the heat-dissipating device will conduct heat of the chip 2 from the conductive board 1 to the fins 3 and dissipate heat to the surrounding air. The heat is then dissipated into the air through air convection.

However, when the conventional heat-dissipating device is applied on a chip of an erect PCB, the heat of the chip is hard to dissipate. The fins 3 are paralleled erectly on the conductive board 1 of the heat-dissipating device. After the lower portion of the fins 3 is heated, the air is expands and rises upwardly. The air increasingly accumulates at the upper portion of the fins 3, and the air cannot dissipate smoothly.

Moreover, the fins are usually arranged tightly to increase the dissipation area of the fins. The narrow intervals between the fins of the above heat-dissipating device cause the airflow to slow and decrease the dissipation effect.

Thus it can be seen that the above-mentioned heat-dissipating device obviously is inconvenient and suboptimal.

By studying the disadvantage of the prior art and possible sustainable development directions, the inventor has invented this device for improving the above-mentioned shortcomings.

SUMMARY OF THE INVENTION

A main object of the present invention is to provide a fan-shaped heat-dissipating device, applied on a chip of an erect PCB and having channels between the fins to enable smooth heat airflow for increasing a dissipation effect thereof.

To achieve the above main objects, the present invention provides a fan-shaped heat-dissipating device assembled on a chip of an erect PCB, and comprises a conductive board and a plurality of fins. The conductive board leans against the chip. The fins are connected erectly on an outside surface of the conductive board, respectively. Each of the fins has an top end and a bottom end, an interval of each two adjacent top ends of the fins being larger that that of each two adjacent bottom ends of the fins. The fins are arranged in a radiating manner toward two sides from the bottom ends to the top ends.

BRIEF DESCRIPTION OF THE DRAWINGS

Other objects, advantages, and novel features of the present invention will become more apparent from the following detailed description when taken in conjunction with the accompanying drawings, in which.

DETAILED DESCRIPTION OF THE INVENTION

Figure 1:
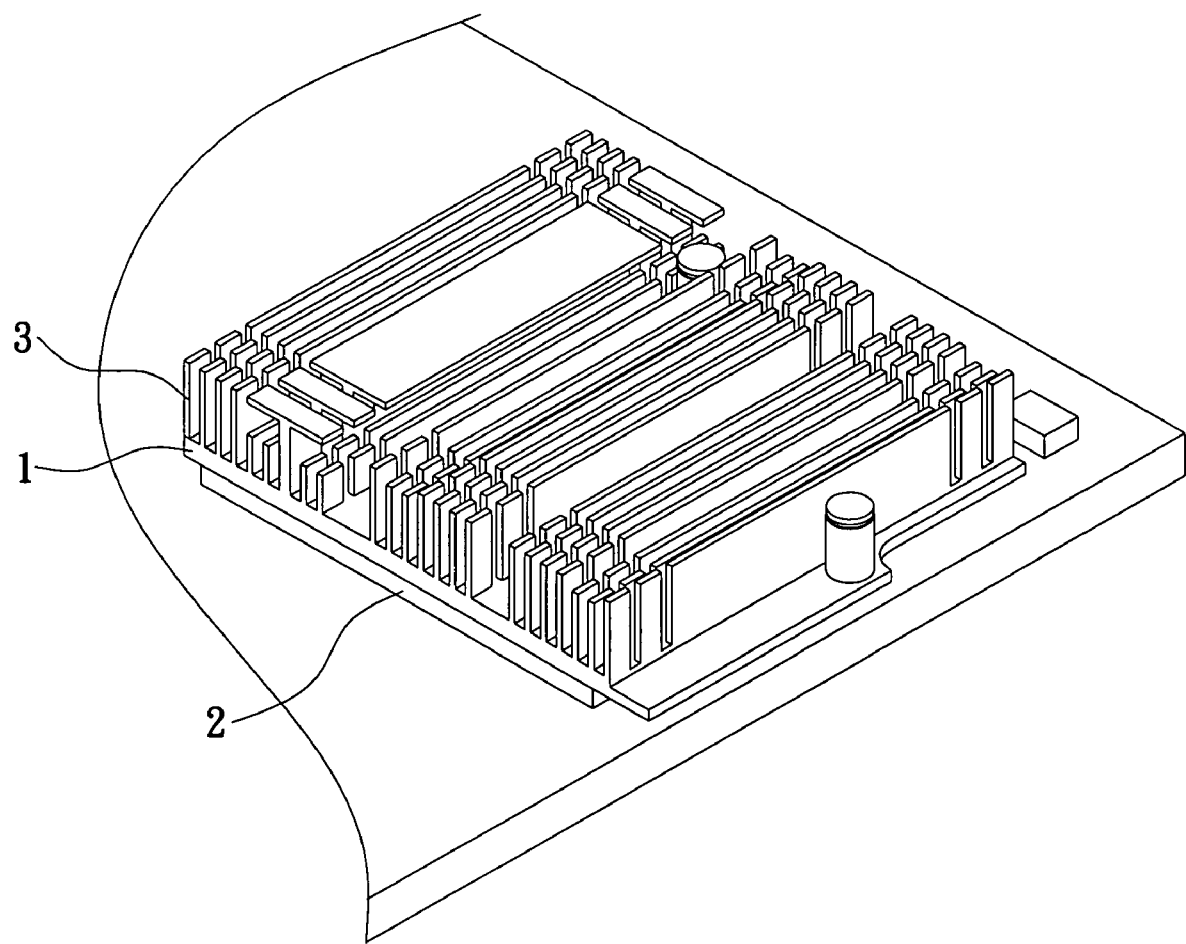
FIG. 1 is a schematic perspective view illustrating a heat-dissipating device according to the prior art.
Figure 2:
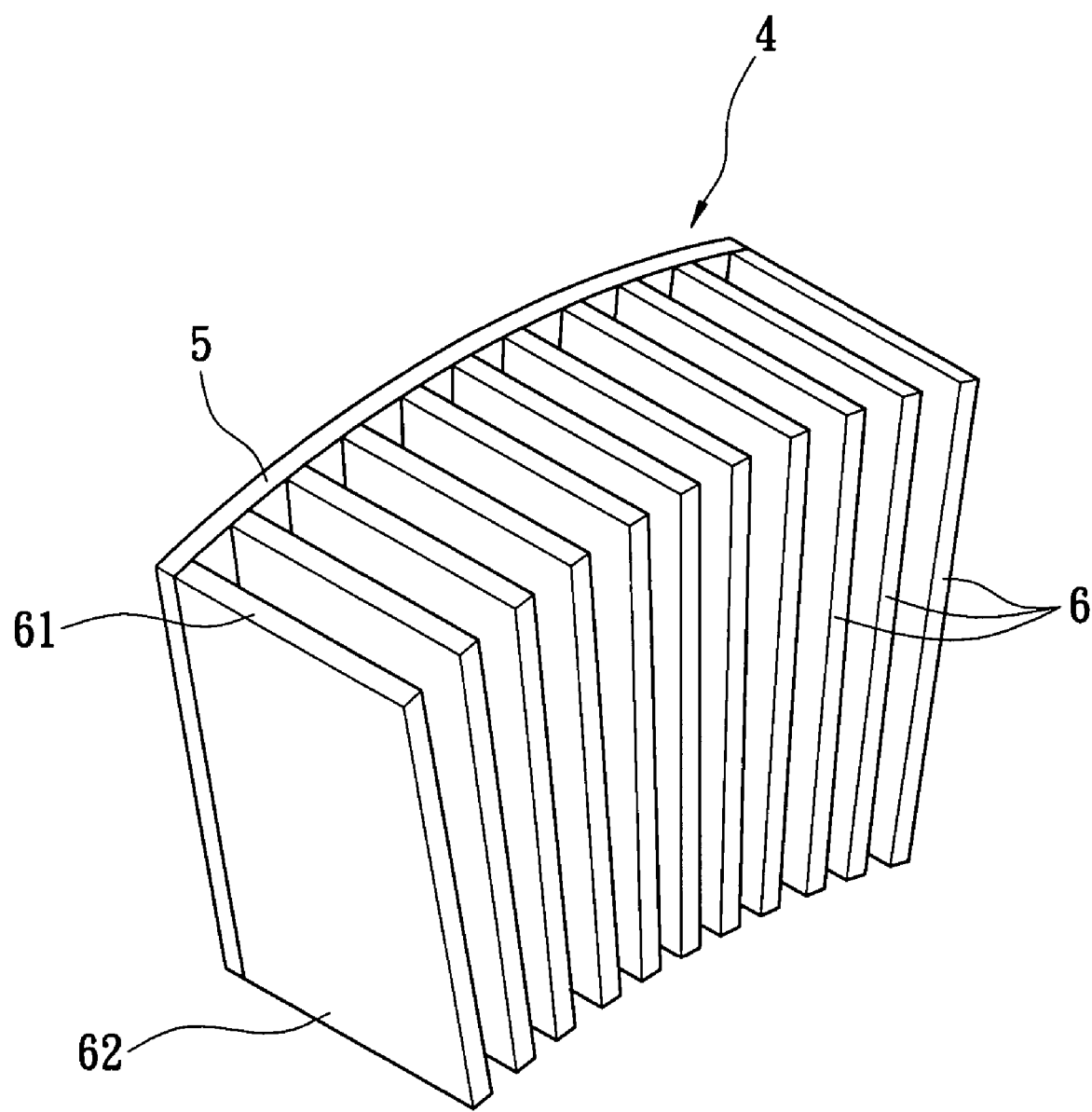
FIG. 2 is a schematic perspective view illustrating a fan-shaped heat-dissipating device according to the present invention.

FIG. 2 is a schematic perspective view of a fan-shaped heat-dissipating device according to the present invention. A fan-shaped heat-dissipating device 4 of the present invention has a conductive board 5 and a plurality of fins 6. The conductive board 5 and the fins 6 are made of highly conductive material, such as alloy of aluminum, or copper, or both. The conductive board 5 leans against a heat source of an electric device. The fins 6 are connected erectly on an outside surface of the conductive board 5, respectively, and arranged in a radiating manner toward two sides from bottom ends to top ends thereof.

Figure 3:
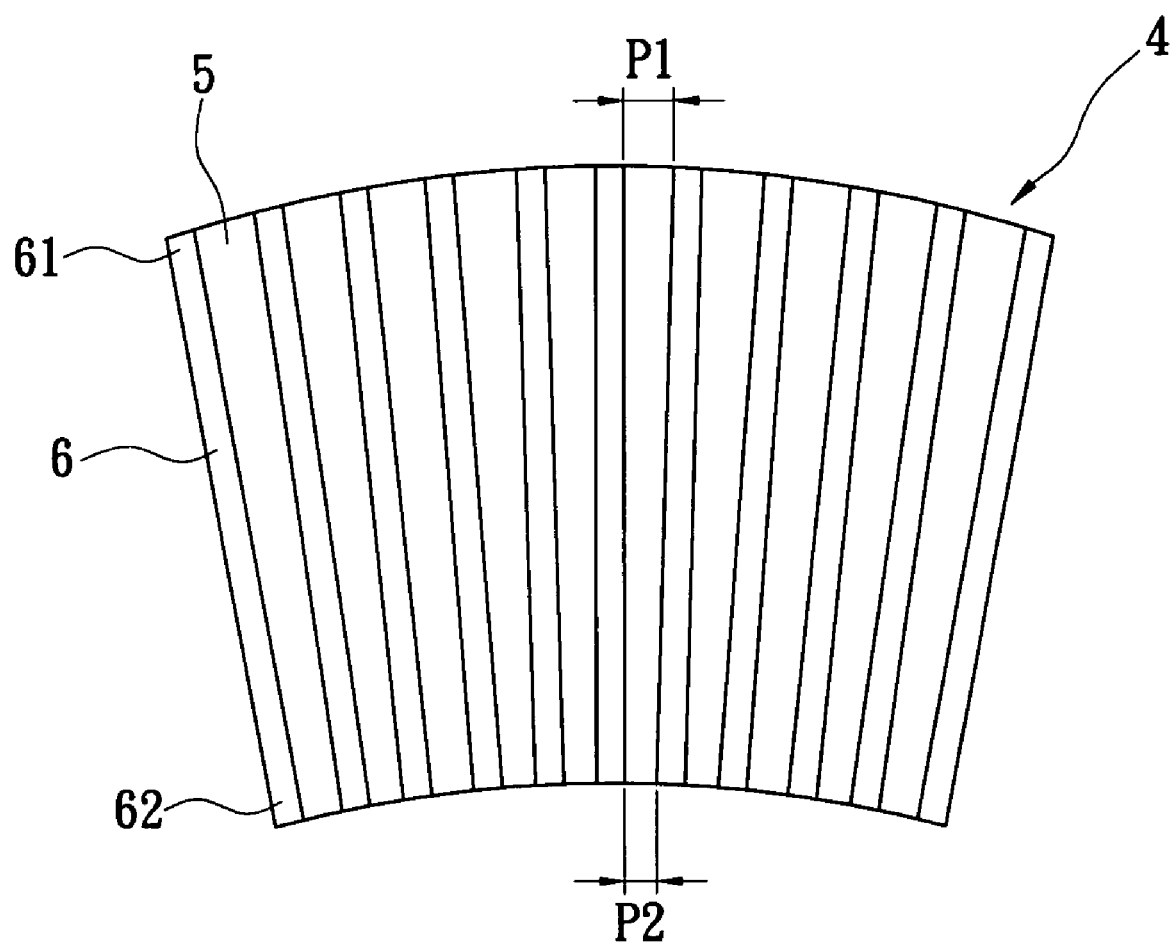
FIG. 3 is a schematic front view of the fan-shaped heat-dissipating device according to the present invention.

Reference is made simultaneously to FIG. 3, which is a schematic front view of the fan-shaped heat-dissipating device according to the present invention. Each of the fins 6 has an top end 61 and a bottom end 62, and an interval P1 of each two adjacent top ends 61 of the fins 6 is larger than an interval P2 of each two adjacent bottom ends 62 of the fins 6. The fins 6 have intervals therebetween, which increase gradually from the top ends 61 to the bottom ends 62, thus providing smooth channels while the hot air is rising. The density of the air, which is accumulated at the top ends 61 of the fins 6 due to the rising thereof, is reduced therefore.

Figure 4:
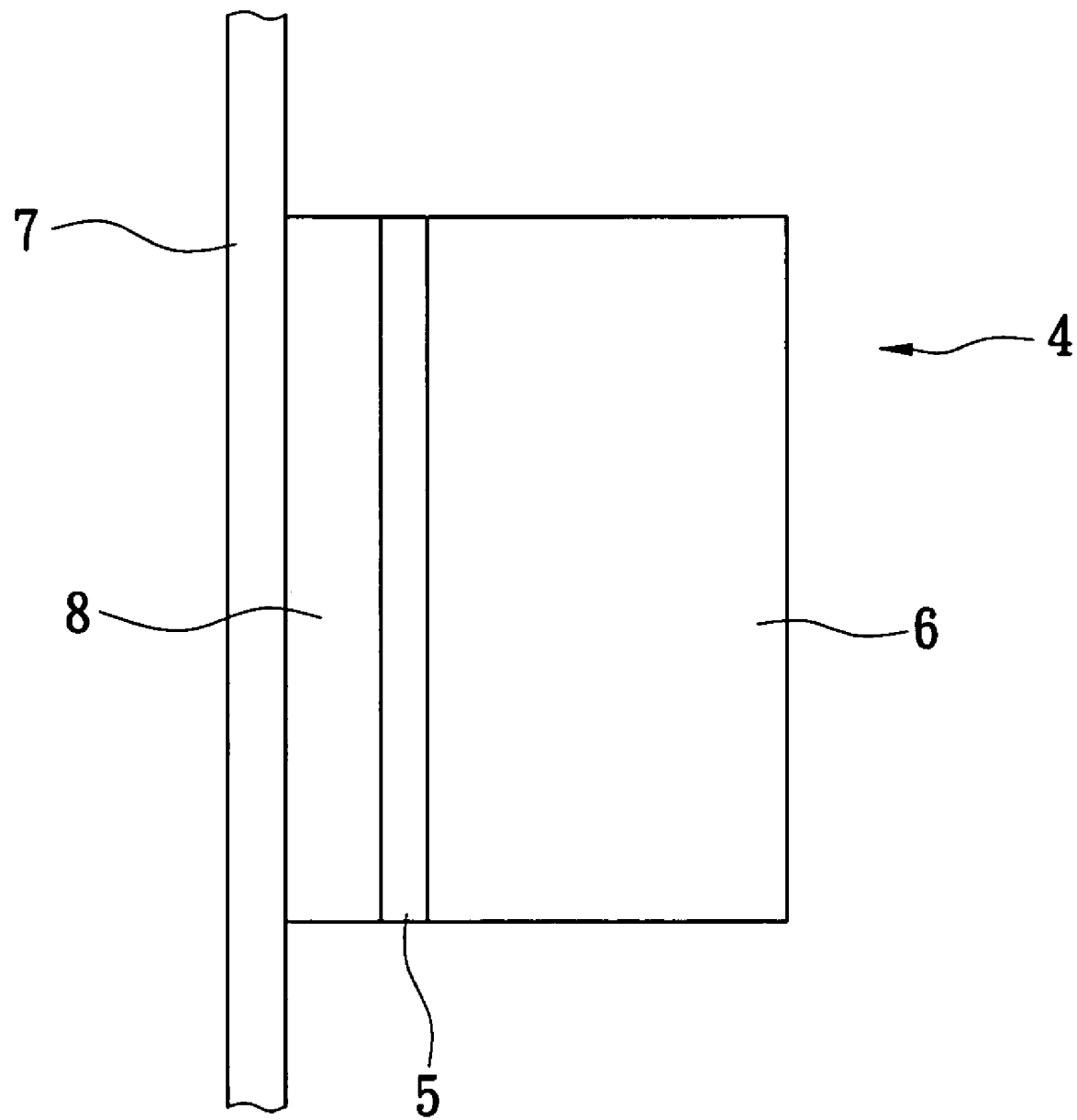
FIG. 4 is a schematic side view of the fan-shaped heat-dissipating device according to the present invention assembled on an erect PCB.

FIG. 4 is a schematic side view of the fan-shaped heat-dissipating device according to the present invention assembled on an erect PCB. When the fan-shaped heat-dissipating device 4 is assembled on a chip 8 of an erect PCB 7 and applied to the dissipation for the chip 8 of the erect PCB 7, it effectively enhances the dissipation effect thereof. Because the hot air rises up, the structure of the fins 6, which is arranged erectly in a radiating fan shape, provides many direct and smooth channels.

The fins 6 of the present invention can be connected to the conductive board 5 by bonding, or soldering, or die-casting. Bonding involves melting two different materials together through a medium, so that it utilizes the physical characteristics of two kinds of materials simultaneously. For example, under high temperature and pressure, melting the fins 6 of aluminum with the conductive board 5 of copper through a material which having appetence with aluminum results in an ultimate product with the characteristics of the high conductivity of copper and the quick dissipation of aluminum.

The fins 6 and the conductive board 5 can be connected together by using a soldering technology of reflowing oven. The fins 6 are first fixed by a fixing tool and positioned on a conductive board 5 spread with soldering tin. The assemblage is passed through a reflow oven at a high temperature to melt the tin and connect both together.

The fins 6 and the conductive board 5 can be formed integrally by die-casting.

Figure 5:
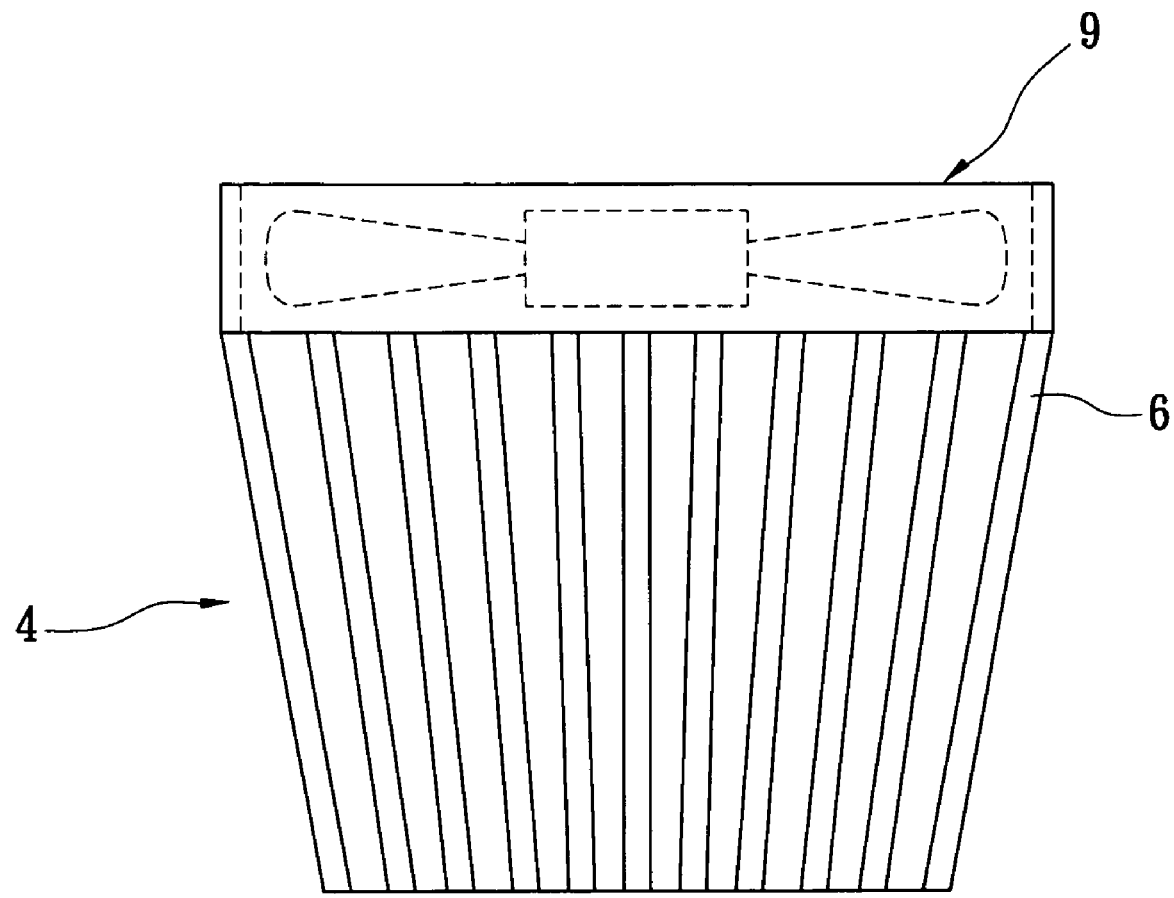
FIG. 5 is a schematic front view of the fan-shaped heat-dissipating device according to the present invention assembled with a fan.
Figure 6:
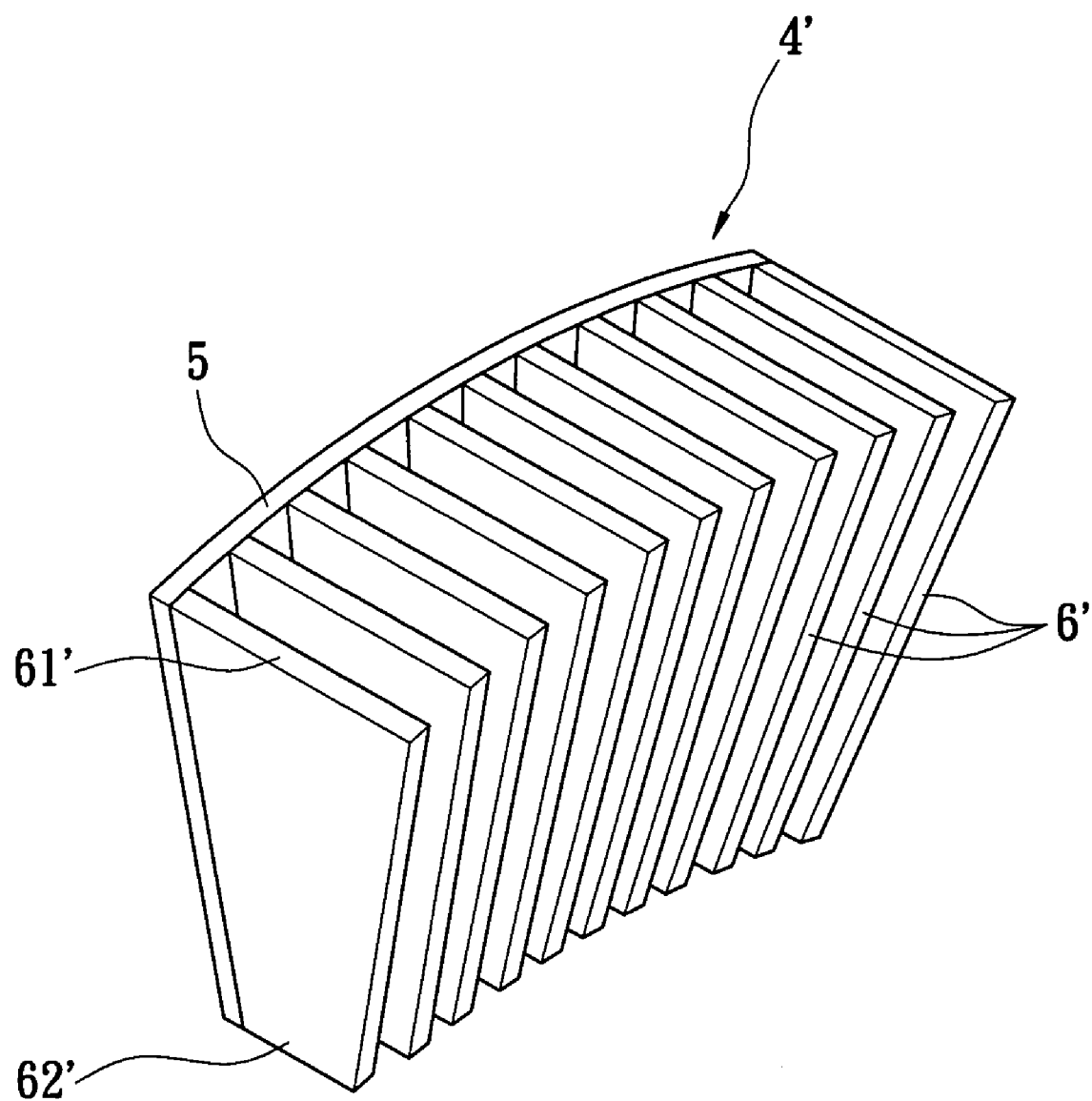
FIG. 6 a schematic perspective view illustrating a fan-shaped heat-dissipating device of a second embodiment according to the present invention.
Figure 7:
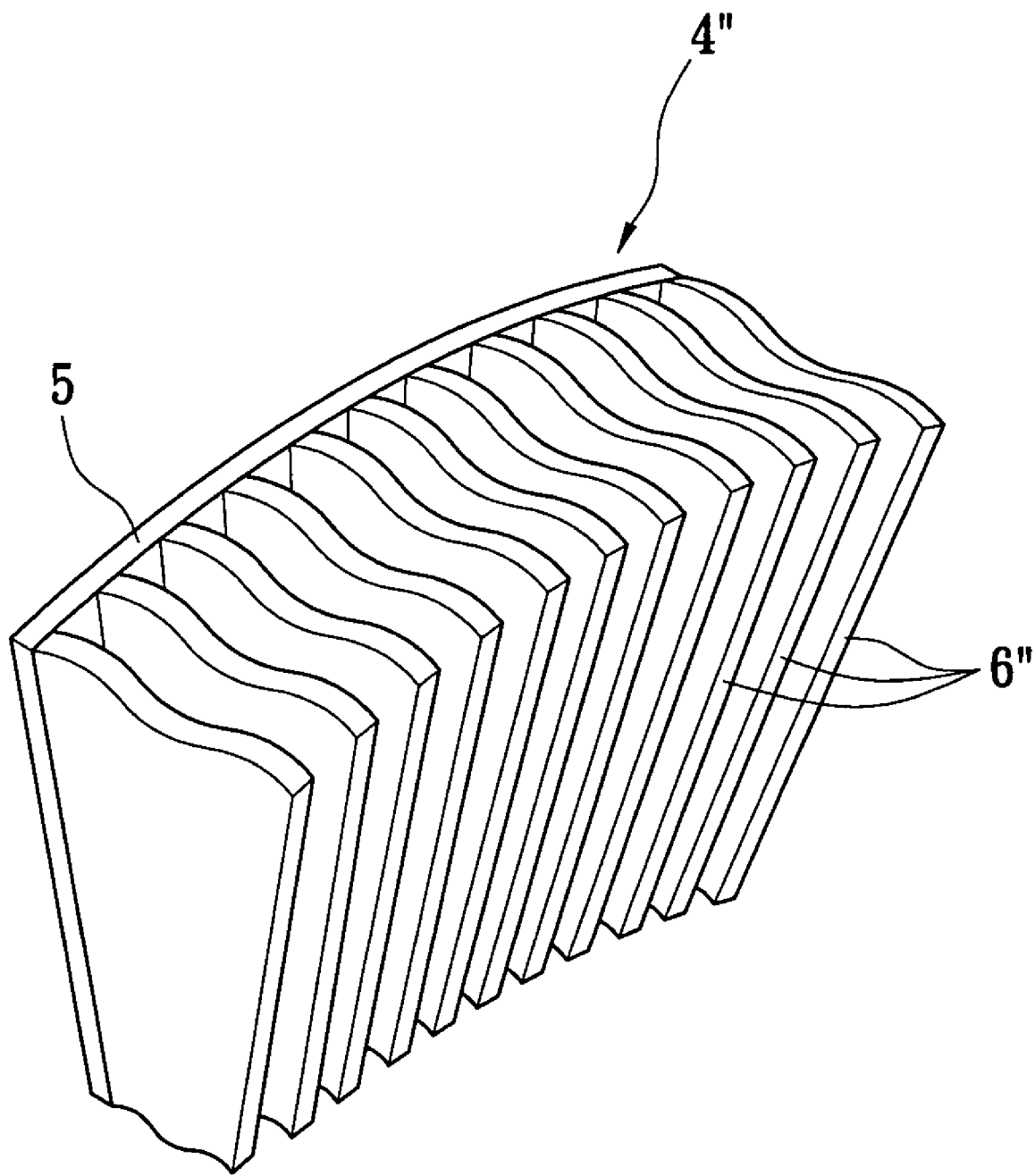
FIG. 7 is a schematic perspective view illustrating a fan-shaped heat-dissipating device of a second embodiment according to the present invention.

FIGS. 5 to 7 illustrate different embodiments of fan-shaped heat-dissipating device according to the present invention. Although the above-mentioned embodiment of the fan-shaped heat-dissipating device 4 provides the fins 6 that are sheet-and-rectangular shaped, and the top ends 61 of the fins 6 are positioned on an arced curve (see FIG. 3), the fins also can be shaped into other forms. For example, as shown in FIG. 5, the top ends of the fins 6 are positioned on a horizontal plane, so that the fan-shaped heat-dissipating device 4 can further have a fan 9 mounted on the top ends thereof. As shown in FIG. 6, each of the fins 6' is shaped into a trapezoid with a wider top end 61' and a narrower bottom end 62'. The area of the upper portion of the fins 6' is enlarged, so that the fan is mounted more conveniently and the dissipation area thereof is increased. Referring to FIG. 7, each of the fins 6" is shaped in a wave, which forms a structure for guiding airflow smoothly without turbulence.

Thereby, the fan-shaped heat-dissipating device of the present invention has advantages as follows:

1. The fan-shaped heat-dissipating device can reduce the density of air accumulated at the top ends 61 of the fins 6 due to the rising hot air, and provide better dissipation.

2. The present invention can particularly enhance dissipation if it is applied on a chip of a PCB that must be positioned erectly. The structure of the radiating fins 6 provides direct and smooth channels for the hot air with a better dissipation effect.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A fan-shaped heat-dissipating device, assembled on a chip of an erect PCB, comprising:
    a conductive board, leaning against the chip;
    a plurality of fins, connected erectly on an outside surface of the conductive board, respectively, wherein each of the fins has an top end and a bottom end, and an interval between each two adjacent top ends of the fins is larger that of each two adjacent bottom ends of the fins, and wherein the fins are arranged in a radiating manner toward two sides from the bottom ends to the top ends; and
    a fan, mounted on the top ends of the fins.

2. The fan-shaped heat-dissipating device as in claim 1, wherein the top ends of the fins are positioned on an arced curve.

3. The fan-shaped heat-dissipating device as in claim 1, wherein the top ends of the fins are positioned on a horizontal plane.

4. The fan-shaped heat-dissipating device as in claim 1, wherein each of the fins is shaped in a sheet-and-rectangular.

5. The fan-shaped heat-dissipating device as in claim 1, wherein each of the fins is shaped in a wave.

6. The fan-shaped heat-dissipating device as in claim 1, wherein each of the fins is shaped in a trapezoid.

7. A fan-shaped heat-dissipating device comprising:
    a conductive board, having a top end, a bottom end and two side ends;
    a plurality of fins, respectively connected on a surface of the conductive board along a direction of the top end to the bottom end, each fin having a first end and a second end, and the first ends being positioned on the top end of the conductive board and the second ends being positioned on the bottom end of the conductive board, wherein an interval between each two adjacent first ends of the fins is larger that between each two adjacent second ends, and the fins are arranged in a radiating manner along a direction from the bottom end to the top end of the conductive board; and
    a fan, mounted on the first ends of the fins.

8. The fan-shaped heat-dissipating device as in claim 7, wherein the first ends of the fins are positioned on an arced curve.

9. The fan-shaped heat dissipating device as in claim 7, wherein the first ends of the fins are positioned on a horizontal plane.

10. The fan-shaped heat-dissipating device as in claim 7, wherein each of the fins is shaped in a sheet-and-rectangular.

11. The fan-shaped heat-dissipating device as in claim 7, wherein each of the fins is shaped in a wave.

12. The fan-shaped heat-dissipating device as in claim 7, wherein each of the fins is shaped in a trapezoid.

* * * * *